US007463523B2

(12) United States Patent
Shino

(10) Patent No.: US 7,463,523 B2
(45) Date of Patent: Dec. 9, 2008

(54) SEMICONDUCTOR MEMORY DEVICE AND METHOD OF DRIVING A SEMICONDUCTOR MEMORY DEVICE

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 665 days.

(21) Appl. No.: 11/236,671

(22) Filed: Sep. 28, 2005

(65) Prior Publication Data

US 2006/0208301 A1 Sep. 21, 2006

(30) Foreign Application Priority Data

Mar. 18, 2005 (JP) ............... 2005-079795

(51) Int. Cl.
*G11C 11/03* (2006.01)
(52) U.S. Cl. ..................... 365/185.18; 365/185.05; 365/185.1; 365/185.15; 365/185.26
(58) Field of Classification Search ............ 365/185.18, 365/185.05, 185.1, 185.15, 185.26
See application file for complete search history.

(56) References Cited

U.S. PATENT DOCUMENTS 6,538,916 B2   3/2003  Ohsawa 6,621,725 B2   9/2003  Ohsawa
6,992,930 B2*  1/2006  Matsuoka et al. ...... 365/185.18
7,262,992 B2*  8/2007  Shibata et al. ......... 365/185.05

FOREIGN PATENT DOCUMENTS

JP   2003-031696   1/2003

\* cited by examiner

*Primary Examiner*—Pho M. Luu
(74) *Attorney, Agent, or Firm*—Oblon, Spivak, McClelland, Maier & Neustadt, P.C.

(57) ABSTRACT

A semiconductor memory device includes a semiconductor layer; a source layer provided in the semiconductor layer; a drain layer provided in the semiconductor layer; a body region provided in the semiconductor layer between the source layer and the drain layer; a gate insulation film provided on the body region; and a gate electrode provided on the gate insulation film, wherein data are written or read out by accumulating electric charge in the body region or releasing electric charge from the body region, and wherein a difference between the potential $V_{SR}$ of the source layer in a data-retaining period and the potential $V_{GR}$ of the gate electrode in the data-retaining period is smaller than a difference between the potential $V_{SW}$ of the source layer in a data write period and the potential $V_{GR}$.

16 Claims, 8 Drawing Sheets

$V_{SW}$ ··· SOURCE VOLTAGE DURING DATA WRITING
$V_{SR}$ ··· SOURCE VOLTAGE DURING DATA RETAINING
$V_{GR}$ ··· GATE VOLTAGE DURING DATA RETAINING $V_{SRO}$ ···SOURCE VOLTAGE DURING DATA READ-OUT
$V_{GRO}$ ···SOURCE VOLTAGE DURING DATA READ-OUT

US 7,463,523 B2

SEMICONDUCTOR MEMORY DEVICE AND METHOD OF DRIVING A SEMICONDUCTOR MEMORY DEVICE

CROSS-REFERENCE TO RELATED APPLICATION

This application is based upon and claims the benefit of priority from the prior Japanese Patent Applications No. 2005-79795, filed on Mar. 18, 2005, the entire contents of which are incorporated herein by reference.

BACKGROUND OF THE INVENTION

1. Field of the Invention

The present invention relates to a semiconductor memory device and a method of driving a semiconductor memory device.

2. Background Art

FBC (Floating Body Cell) memory is remarked as a semiconductor memory device in place of DRAM. FBC memory stores data "1" or "0" by accumulating holes in a body region or releasing holes therefrom. FBC memory is more advantageous in microminiaturization than 1T-1C (1 Transistor-1 Capacitor) type DRAM.

However, to keep the state of retaining holes in the body region (the state of data "1"), it is necessary to keep the gate electrode in a large negative potential. Therefore, an intensive electric field is applied between the junction of the body region and the source/drain layer in the reverse-bias direction. This electric field has a function of accumulating holes in the body region in the state not to retain holes (the state of data "0"). There occurs the problem of data retention, namely, deterioration of the capability of retaining data "0" (see U.S. Pat. No. 6,621,725).

SUMMARY OF THE INVENTION

A semiconductor memory device according to an embodiment of the present invention includes a semiconductor layer; a source layer provided in the semiconductor layer; a drain layer provided in the semiconductor layer; a body region provided in the semiconductor layer between the source layer and the drain layer; a gate insulation film provided on the body region; and a gate electrode provided on the gate insulation film, wherein data are written or read out by accumulating electric charge in the body region or releasing electric charge from the body region, and wherein a difference between the potential $V_{SR}$ of the source layer in a data-retaining period and the potential $V_{GR}$ of the gate electrode in the data-retaining period is smaller than a difference between the potential $V_{SW}$ of the source layer in a data write period and the potential $V_{GR}$.

A semiconductor memory device according to an embodiment of the present invention includes a semiconductor layer; a source layer provided in the semiconductor layer; a drain layer provided in the semiconductor layer; a body region provided in the semiconductor layer between the source layer and the drain layer; a gate insulation film provided on the body region; and a gate electrode provided on the gate insulation film, wherein data are written or read out by accumulating electric charge in the body region or releasing electric charge from the body region, and wherein a difference between the potential $V_{SRO}$ of the source layer in a data-readout period and the potential $V_{GRO}$ of the gate electrode in the data-readout period is smaller than a difference between the potential $V_{SR}$ of the source layer in a data-retaining period and the potential $V_{GRO}$.

A method of driving a semiconductor memory device according to an embodiment of the present invention, the semiconductor memory device includes a semiconductor layer, a source layer provided in the semiconductor layer, a drain layer provided in the semiconductor layer, a body region provided in the semiconductor layer between the source layer and the drain. layer, a gate insulation film provided on the body region and a gate electrode provided on the gate insulation film, the method includes applying potential $V_{GW}$ to the gate electrode and applying potential $V_{SW}$ to the source layer, thereby executing data write; and applying potential $V_{GR}$ to the gate electrode and applying potential $V_{SR}$ to the source layer, and thereby retaining data, the potential $V_{SR}$ having a smaller difference from the potential $V_{GR}$ than the difference between the potential $V_{SW}$ and the potential $V_{GR}$.

A method of driving a semiconductor memory device according to an embodiment of the present invention, the semiconductor memory device includes a semiconductor layer, a source layer provided in the semiconductor layer, a drain layer provided in the semiconductor layer, a body region provided in the semiconductor layer between the source layer and the drain layer, a gate insulation film provided on the body region and a gate electrode provided on the gate insulation film, the method includes applying potential $V_{GR}$ to the gate electrode and applying potential $V_{SR}$ to the source layer, thereby executing data write; and applying potential $V_{GRO}$ to the gate electrode and applying potential $V_{SRO}$ to the source layer, and thereby read out data, the potential $V_{SRO}$ having a smaller difference from potential $V_{GRO}$ of the gate electrode in the data write period than the difference between the potential $V_{SR}$ and the potential $V_{GRO}$.

DETAILED DESCRIPTION OF THE INVENTION

Embodiments of the invention will now be explained below with reference to the drawings. The embodiments, however, should not be construed to limit the invention.

First Embodiment

Figure 1:
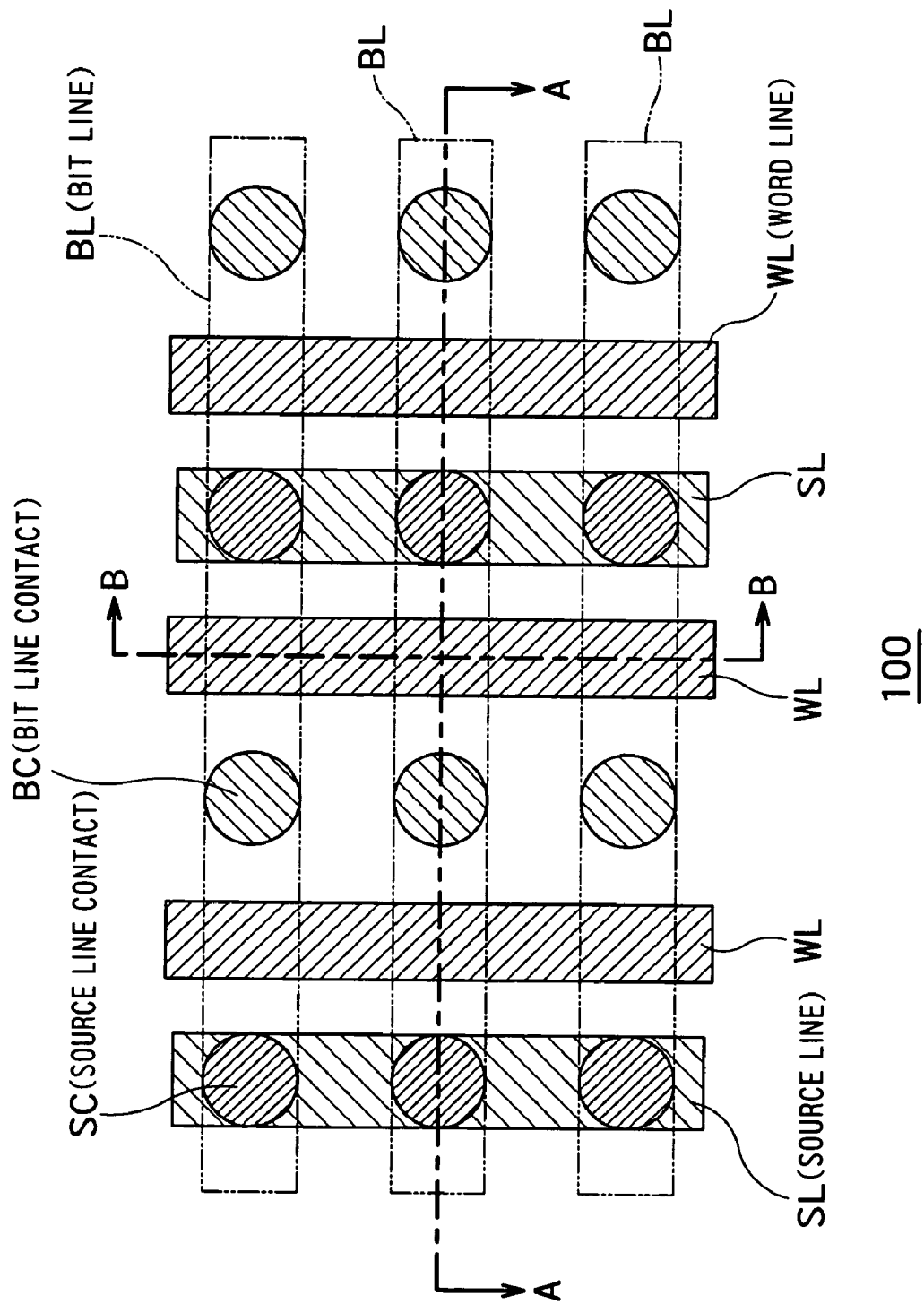
FIG. 1 is a plan view of FBC memory 100 according to the first embodiment of the invention.

FIG. 1 is a plan view of FBC memory 100 (hereafter called memory 100 as well) according to the first embodiment of the invention. A peripheral circuit (not shown) for controlling the memory 100 may be provided on the periphery of the memory 100.

The memory 100 has word lines WL, bit lines BL and source lines SL. The word lines WL and the source lines SL extend approximately in parallel. The bit lines BL extend substantially perpendicularly to the word lines WL and the source lines SL. Bit line contacts BC electrically connect the bit lines BL to drain layers (see FIG. 2) underlying the bit lines BL.

Memory cells (see FIG. 2) are situated at crossing points of the word lines WL and the bit lines BL. A plurality of memory cells MC are aligned in a matrix to form a memory cell array. Each word line WL is provided for each row of the memory cell array, and each bit line BL is provided for each column of the memory cell array. Each source line is associated with each word line WL. Positional relation between the rows and the columns can be changed vice versa.

Figure 2:
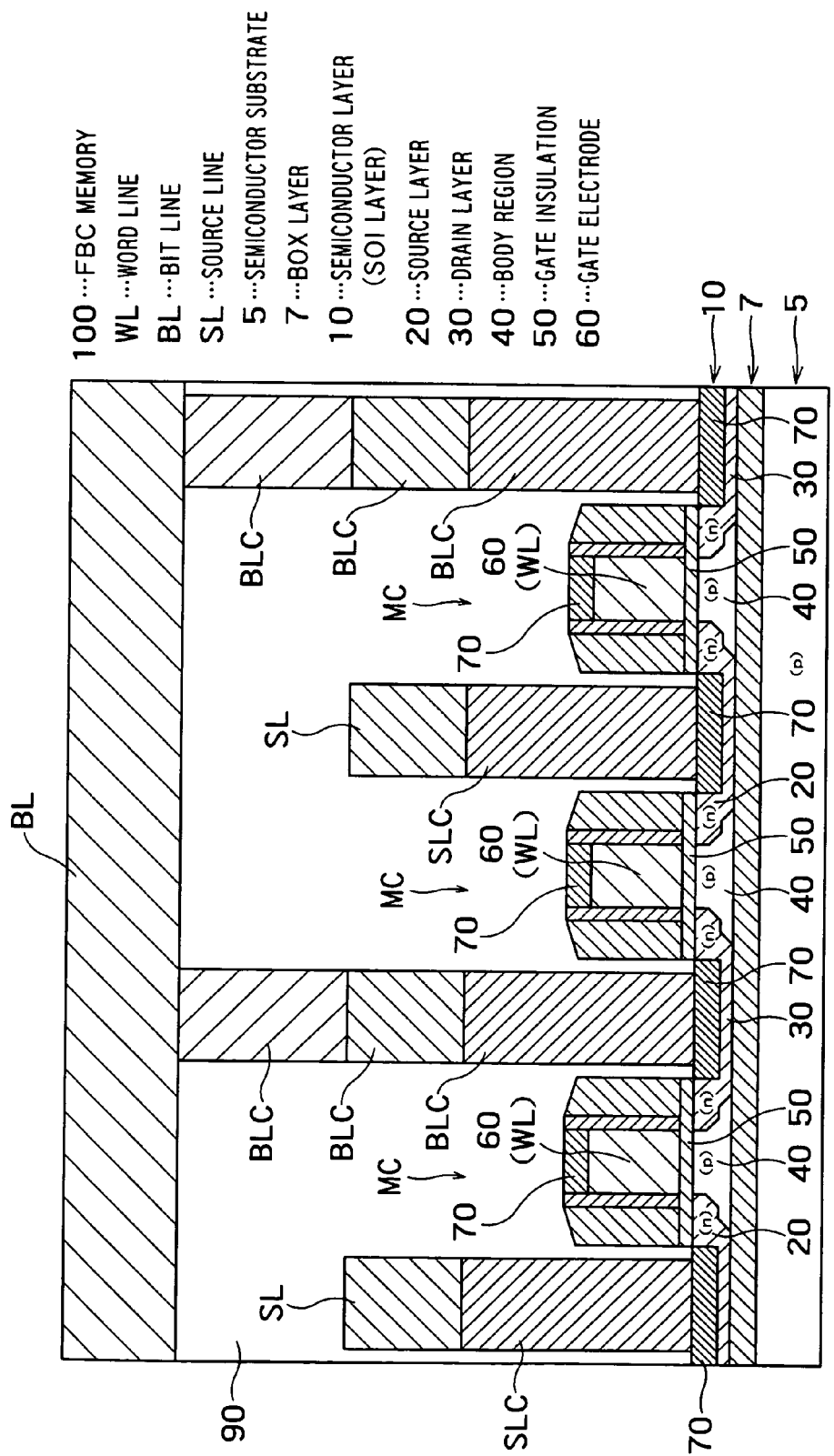
FIG. 2 is a cross-sectional view taken along the A-A line of FIG. 1.
Figure 3:
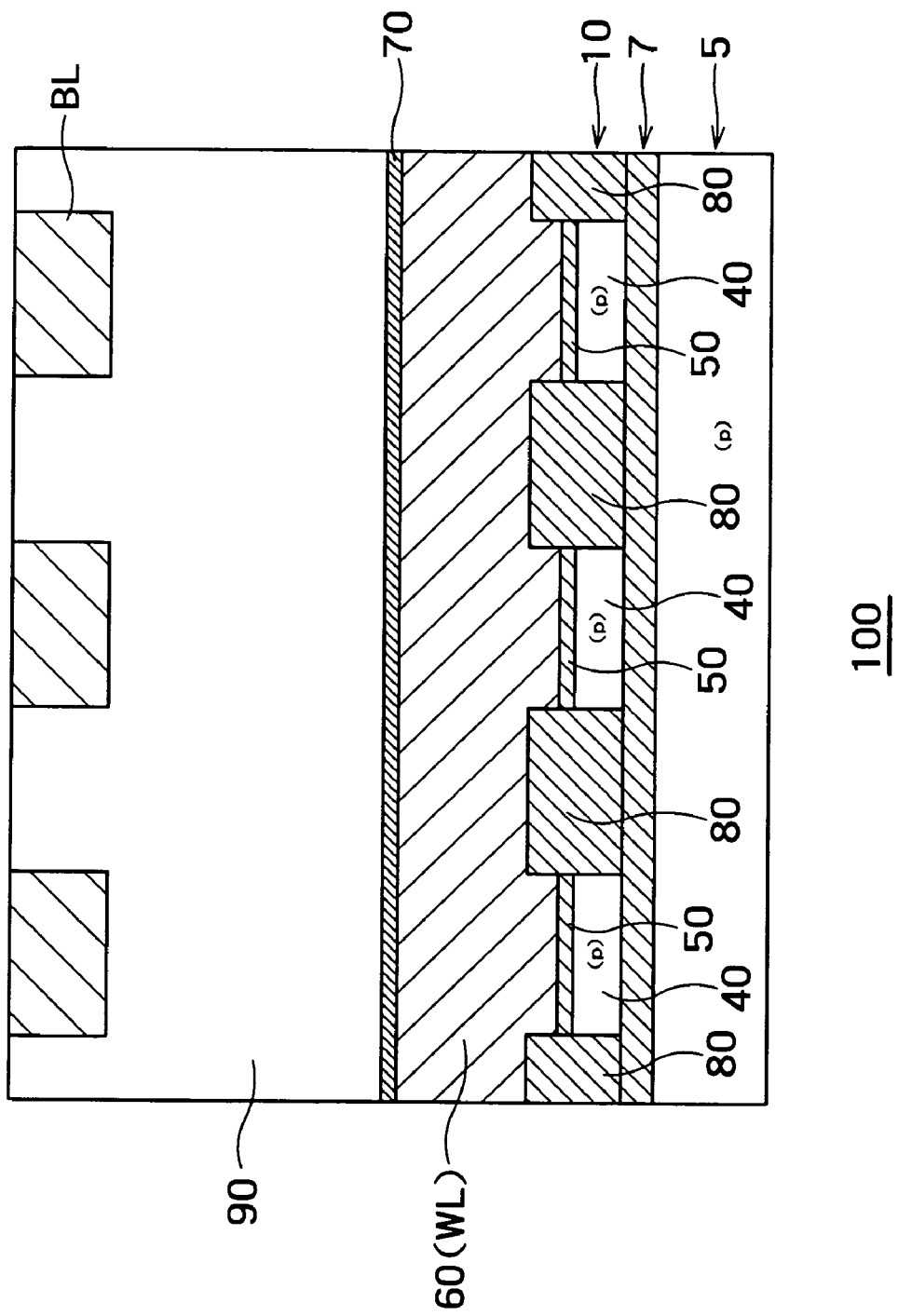
FIG. 3 is a cross-sectional view taken along the B-B line of FIG. 1.

FIG. 2 is a cross-sectional view taken along the A-A line of FIG. 1. FIG. 3 is a cross-sectional view taken along the B-B line of FIG. 1. In FIG. 2, three memory cells MC are shown, and each memory cell MC includes a semiconductor substrate 5, BOX layer 7, semiconductor layer 10, n-type source layer 20, n-type drain layer 30, p-type body region 40, gate insulation film 50, and gate electrode (hereafter called a word line as well) 6.

The source layer 20 and the drain layer 30 are formed within the semiconductor layer. The body region 40 is formed within the semiconductor layer 10 between the source layer 20 and the drain layer 30. The gate insulation film 50 overlies the body region 40. The gate electrode 60 lies on the gate insulation film 50.

The semiconductor layer 10 may be a SOI layer, for example, made of single-crystalline silicon. The gate insulation film 50 may be a silicon oxide film, for example. The gate electrode 60 may be a doped polysilicon or metal, for example. As such, the memory cells MC are formed as MOS transistors on the SOI substrate.

The memory 100 further includes a silicide layer 70. The silicide layer 70 lie on the source lines 20, drain layers 30 and word lines 60 to reduce the resistance of the source layers 20, drain layers 30 and word lines 60.

An interlayer insulation film 90 is provided in the space between the word lines WL and the bit lines BL. The interlayer insulation film 90 may be a silicon oxide film, for example. As shown in FIG. 3, STIs (Shallow Trench Isolations) 80 formed in front and rear, or right and left, of each body region 40. The STIs 80 are formed by filling silicon oxide films in trenches. Each body region 40 is insulated from the source layer 20, drain layer 30, gate electrode 60 and other memory cells, and it is in an electrically floating state. Therefore, potential of the body region 40 can change depending upon the potentials of the substrate 5, word line WL, source layer 20 and drain layer 30. The FBC memory can store data by accumulating electrical charge in, or releasing it from, the body region 40.

Figure 4:
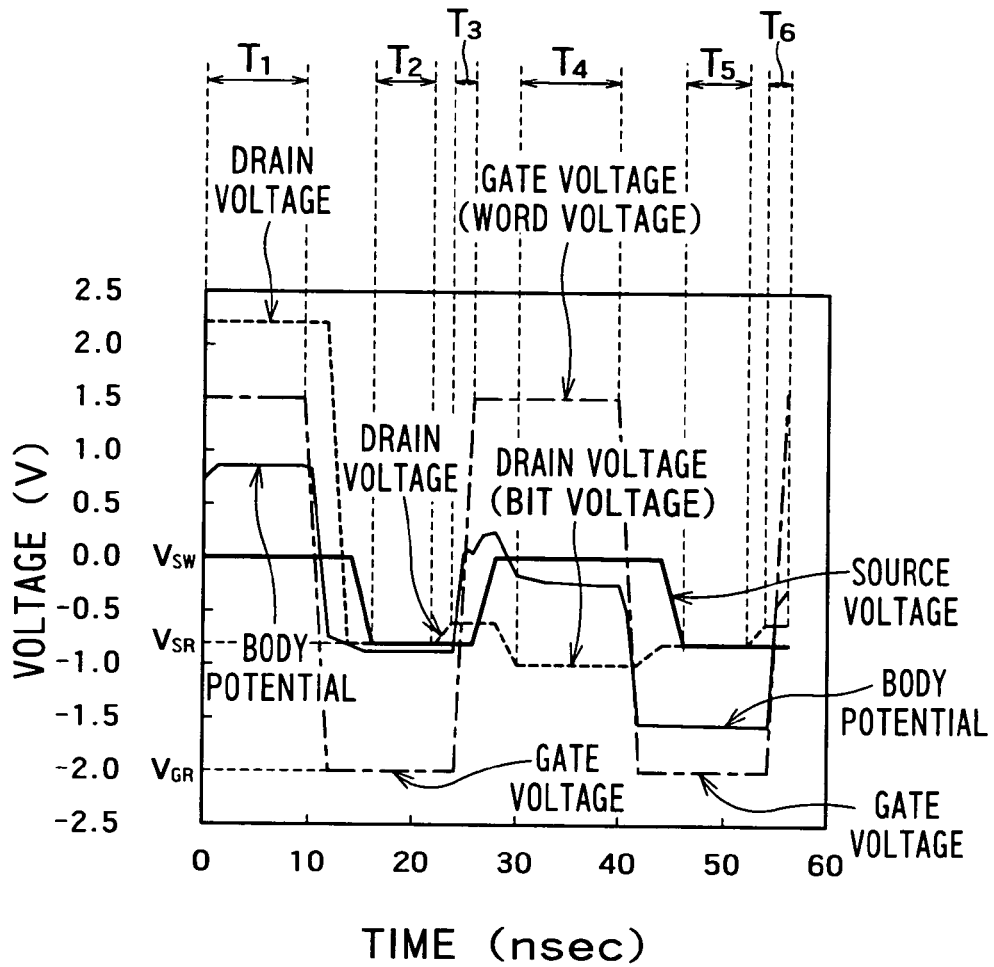
FIG. 4 is a timing chart showing a result of simulation of behaviors of the memory 100.

FIG. 4 is a timing chart showing a result of simulation of behaviors of the memory 100. The thick line shows the source voltage. The thin line shows the body potential. The broken line shows the drain voltage (bit voltage). The long and short dash line shows the gate voltage (word voltage). The source voltage is a voltage of the source layer 20 or a voltage of the source line SL. The body potential is the potential of the body region 40. The drain voltage is the potential of the drain layer 30 or the bit line BL. The gate voltage is the potential of the gate electrode 60 or the word line WL.

Let $V_{GW}$, $V_{SW}$ and $V_{DW}$ represent the gate voltage, source voltage and drain voltage in the data write period, respectively. Let $V_{GR}$, $V_{SR}$ and $V_{DR}$ represent the gate voltage, source voltage and drain voltage in the data-retaining period, respectively. Let $V_{GRO}$, $V_{SRO}$, and $V_{DRO}$ represent the gate voltage, source voltage and drain voltage in the data read period, respectively.

For simulation, N-channel FBC memory 100 (hereafter called memory 100 as well) was used. This memory 100 has the following structure. The gate length is 0.12 μm. Thickness of the gate insulation film (silicon oxide film) 50 is 6 nm. Thickness of the semiconductor layer (SOI) 10 is 25 nm. Thickness of the BOX layer 7 is 14 nm. Acceptor impurity concentration in the body region 40 is approximately $1.6 \times 10^{18}$ cm$^{-3}$. Acceptor impurity concentration of the P-type semiconductor substrate 5 is approximately $1.8 \times 10^{18}$ cm$^{-3}$.

In FIG. 4, in time period $T_1$ from 0 nsec to 10 nsec, data "1" is written in the memory cell MC. In time period $T_2$ from 14 nsec to 22 nsec, data "1" is retained in the memory MC. In time period $T_3$ from 24 nsec to 26 nsec, data "1" is read out from the memory cell MC. In time period $T_4$ from 30 nsec to 40 nsec, data "0" is written in the memory cell MC. In time period $T_5$ from 44 nsec to 52 nsec, data "0" is retained in the memory cell MC. In time period $T_6$ from 54 nsec to 56 nsec, data "0" is read out.

In time period $T_1$, the gate voltage $V_{GW}$ is set to 1.5 V and the drain voltage $V_{DW}$ to 2.2 V, for example, to write data "1" in the memory cell MC. The source voltage $V_{SW}$ is the reference voltage, which may be 0 V, for example. Thereby the FBC is biased to the saturated condition, and brings about impact ionization in the body region 40. As a result, holes are accumulated in the body region 40, and the potential of the body region rises accordingly. This is the state where data "1" has been written. This writing operation may be identical to that of conventional memory.

In time period $T_2$, the gate voltage is shifted to a negative potential (−2 V for example) to retain data "1" in the memory cell MC. The body potential varies toward the gate voltage $V_{GR}$ due to capacity coupling of the body region 40 and the gate electrode 60. For example, the body potential is shifted to −0.808V.

Further, the source voltage is changed in the same direction as the shifting direction of the gate voltage (toward a negative potential). For example, the source voltage is shifted from 0 V to −0.8 V. The drain voltage is shifted to the voltage identical to the source voltage as well. As such, difference (for example 1.2 V) of the source voltage $V_{SR}$, the drain voltage $V_{DR}$ in the data-retaining period (for example, −0.8 V) from the gate voltage $V_{GR}$ in the data-retaining period (for example −2 V) is smaller than difference (for example 2 V) between the source voltage $V_{SW}$ in the data write period (for example 0 V) and the gate voltage $V_{GR}$ (for example −2 V). Under the condition, the body potential changes further toward the gate voltage $V_{GR}$ due to capacity coupling of the body region 40 with the source layer 20 and the drain layer 30. For example, the body potential changes to −0.828 V.

In this embodiment, the body potential becomes a negative potential (for example −0.882 V). The drain voltage $V_{DR}$ and the source voltage $V_{SR}$ is set to a voltage approximately equal to the body potential while retaining data "1". In this case, since the junctions of the body region 40 and the source/drain layers 20, 30 are under thermal equilibrium conditions, strength of the electric field applied to the junctions is lower than that in conventional devices, but it is immaterial for the hole retaining capability. Therefore, the memory cell MC can sufficiently retain data "1".

In case the voltage value of the drain voltage $V_{DR}$ and the source voltage $V_{SR}$ is somewhat higher than the body potential retaining data "1", reverse bias is applied to the junctions between the body region 40 and the source/drain layers 20, 30. This is immaterial because the memory cell MC can retain data "1". On the other hand, in case the voltage value of the drain voltage $V_{DR}$ and the source voltage $V_{SR}$ is somewhat lower than the body potential while retaining data "1", forward bias is applied to the junctions of the body region 40 and the source/drain layers 20, 30. In this case, holes gradually flow out from the body region retaining data "1", and the body potential approaches the drain voltage $V_{DR}$ and the source voltage $V_{SR}$. However, leak current to the body region retaining data "0" reduces with the present invention. Therefore, as long as data "1" and data "0" can be distinguished for a longer time than in conventional devices, the voltage value of the drain voltage $V_{DR}$ and the source voltage $V_{SR}$ may be lower than the body potential retaining data "1".

In time period $T_3$, the gate voltage is set to a positive potential (for example 1.5 V) to read out data "1" from the memory cell MC. Simultaneously, the drain voltage is changed in the same direction as the shifting direction of the gate voltage with respect to the source voltage. For example, the drain voltage is changed from −0.8 V to −0.6 V. The source voltage remains −0.8 V. Thereby, a sense amplifier (not shown) detects the drain current and discriminates data.

In time period $T_4$, the gate voltage $V_{GW}$ is set to 1.5 V and the drain voltage $V_{DW}$ to −1 V, for example, to write data "0" in the memory cell MC. The source voltage $V_{SW}$ is the reference voltage, which may be 0 V, for example. Thereby, the pn junction between the body region 40 and the drain layer 30 is biased forward. Therefore, holes stored in the body region 40 annihilate, and the potential of the body region 40 decreases. This is the state where data "0" has been written. This write operation may be identical to the conventional operation.

In time period $T_5$, data "0" is retained in the memory cell MC. The gate voltage, source voltage and drain voltage in the data retaining operation in time period $T_5$ are identical to those in time period $T_2$. Therefore, difference (for example 1.2 V) of the voltage value (for example −0.8 V) of the source voltage $V_{SR}$ and the drain voltage $V_{DR}$ in the data-retaining period and the gate voltage $V_{GR}$ in the data-retaining period (for example −2 V) is smaller than difference (for example 2 V) between the source voltage $V_{SW}$ in the data write period (for example 0 V) and the gate voltage $V_{GR}$.

Under the condition, the body potential changes to approach the gate voltage $V_{GR}$. In the case where data "0" is retained, holes accumulated in the body region are less. At this time, therefore, the body potential becomes a negative potential (for example −1.53 V) deeper than the body potential retaining data "1". Potential difference between the body potential and the source voltage and potential difference between the body potential and drain voltage become 0.73 V, for example. Under these potential differences, junctions between the body region 40 and the source/drain layers 20, 30 are in a reverse bias condition. The maximum electric field then applied to the body region was 0.488 MV/cm.

In conventional FBC memory, the source voltage was not changed but always fixed to the reference voltage. Accordingly, the drain voltage was set to the reference voltage in the data retaining state. On the other hand, the gate voltage must be changed to a predetermined negative potential (for example −2.0 V) similarly to the first embodiment to retain data. Thus, in the conventional FBC memory, the body potential becomes a negative potential (for example −1.53 V) as well. Therefore, potential difference between the body potential and the source voltage and potential difference between the body potential and the drain voltage were larger than those of the first embodiment. For example, they were 1.53 V. Under these potential differences, the junctions of the body region and the source/drain layers are in a reverse bias condition. Therefore, the maximum electric field applied to the body region was relatively as large as 0.708 MV/cm.

Note that the numerical values shown in conjunction with conventional devices are results of a simulation using FBC memory having a device structure similar to that of the instant embodiment.

Difference $\Delta Vt$ between the threshold voltage of the memory cell storing data "0" and the threshold voltage of the memory cell storing data "1" was 0.504 V in the conventional memory whereas it was 0.486 V in the first embodiment. The threshold voltage difference $\Delta Vt$ of the first embodiment is slightly smaller than that of the conventional memory, but it is an immaterial level for discrimination of data.

In general, in case a reverse bias is applied to junctions between the body region and the source/drain layers, there is a leak current inevitably. Therefore, if a larger electric field is built in the junctions, more holes leak to the body region, and the potential of the body region retaining data "0" rises early. As a result, the time retaining data "0" is shortened.

In the first embodiment, both the source voltage $V_{SR}$ and the drain voltage $V_{GR}$ are changed toward the gate voltage $V_{GR}$. This enables effective decrease of the maximum electric field strength applied to the body region 40. As a result, the first embodiment can retain data "0" for a longer time than conventional memory.

In the time period T6, the gate voltage is set to a positive potential (for example, 1.5V) to read out data "0" from FBC memory 100. Simultaneously, the drain voltage is changed in the same direction as the shifting direction of the gate voltage with respect to the source voltage. For example, the drain voltage is changed from −0.8 V to −0.6 V. The source voltage remains −0.8 V. Thereby, a sense amplifier (not shown) detects the drain current and discriminates data. Thus, data writing, data reading and data retention are performed.

In the first embodiment, both the source voltage $V_{SR}$ and the drain voltage $V_{GR}$ are changed toward the gate voltage $V_{GR}$. This enables effective decrease of the electric field strength applied to the body region 40. As a result, the first embodiment can retain data "0" for a longer time than conventional memory.

Furthermore, in the data-retaining period, the body region 40 retaining data "1" and the source/drain layer 20, 30 are in thermal equilibrium. As a result, the capability of retaining data "1" does not deteriorate. Further, even when the source/drain layers 20, 30 and the body region 40 are under a state slightly deviating from the thermal equilibrium, the first embodiment can maintain the threshold voltage difference $\Delta Vt$ enabling identification of data for a longer time than conventional memory.

In the first embodiment, upon transition from the data write state to data-retaining state (T1~T2), after the gate voltage became $V_{GR}$, the source voltage changes from $V_{SW}$ to $V_{SR}$, and the drain voltage changes from $V_{DW}$ to $V_{DR}$. This is for the purpose of retaining accumulated holes in the body region 40 and maintaining a high level of the threshold voltage difference $\Delta Vt$. In greater detail, while the word line WL is driven, a channel is formed. Therefore, the body region 40 is in capacity coupling with the source layer 20, drain layer 30 and channel. In this status, when potentials of the source layer 20 and the drain layer 30 are changed, the potential changes more. On the other hand, while the word line WL is not driven, no channel is formed. Therefore, capacity coupling of the body region 40 and a channel does not occur. Then, when potentials of the source layer 20 and the drain layer 30 are changed, the change of the body potential is relatively small. With a small change of the body region 40, annihilation of holes decreases. As a result, the level of the threshold voltage difference $\Delta Vt$ can be kept higher.

Upon transition from the data write state to the data-retaining state, it is desirable that the change of the source voltage from $V_{SW}$ to $V_{SR}$ and the change of the drain voltage from $V_{DW}$ to $V_{DR}$ occur simultaneously. Thereby, the first embodiment can shorten the cycle time of data read, data write and data retention, and enables high-speed access to the FBC memory.

It is also possible to reduce the ratios of the drain-body capacitance and the source-body capacitance relative to the total capacitance of the body region 40 to bring about simultaneous transition of the gate voltage, source voltage and drain voltage from the write state to the retaining state. Thereby, the first embodiment can shorten the cycle time of data read, data write and data retainment furthermore, and enables high-speed access to the FBC memory.

To reduce the ratios of the drain-body capacitance and the source-body capacitance relative to the total capacitance of the body region 40, one possible way is to reduce the drain-body capacitance and the source-body capacitance, and another possible way is to increase the capacitance between the body region 40 and the semiconductor substrate 5. To reduce the drain-body capacitance and the source-body capacitance, the SOI layer 10 may be thinned. To increase the capacitance between the body region 40 and the semiconductor substrate 5, the BOX layer 7 may be thinned.

Figure 5:
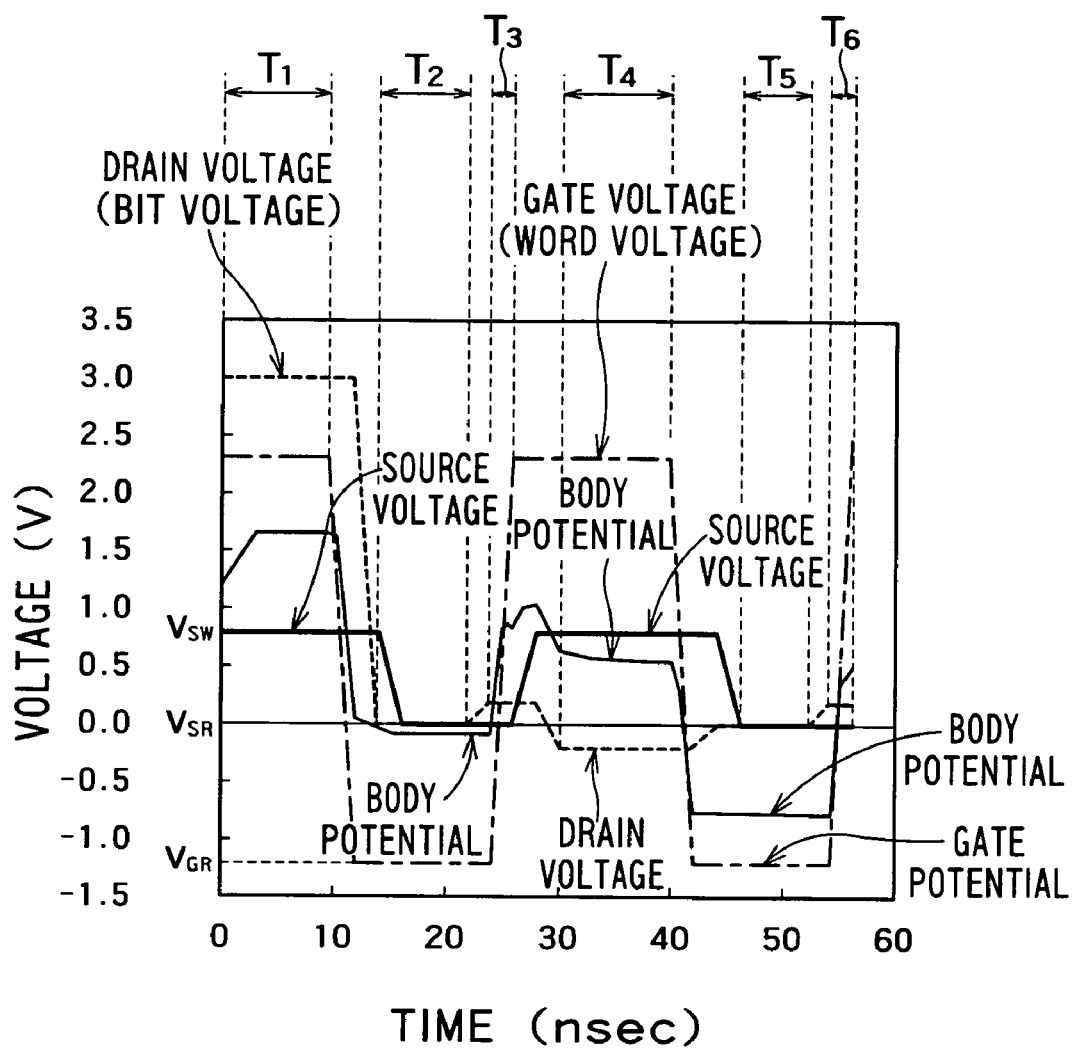
FIG. 5 is a timing chart showing a result of a simulation of other operations of the FBC memory 100.

FIG. 5 is a timing chart showing a result of a simulation of other operations of the FBC memory 100. In the operations shown in FIG. 5, the source voltage, drain voltage, gate voltage and body potential shown in FIG. 4 are shifted so that the source voltage and the drain voltage in the data-retaining period become 0 V. Comparing with FIG. 4, these voltage values in FIG. 5 are shifted by +0.8 V in the positive voltage direction.

The maximum electric field applied to the body region 40 is determined by the relative potential difference of the source voltage and the drain voltage from the body potential. Therefore, even when the source voltage, drain voltage, gate voltage and body potential are shifted entirely, the effects of the first embodiment are not lost.

Second Embodiment

Figure 6:
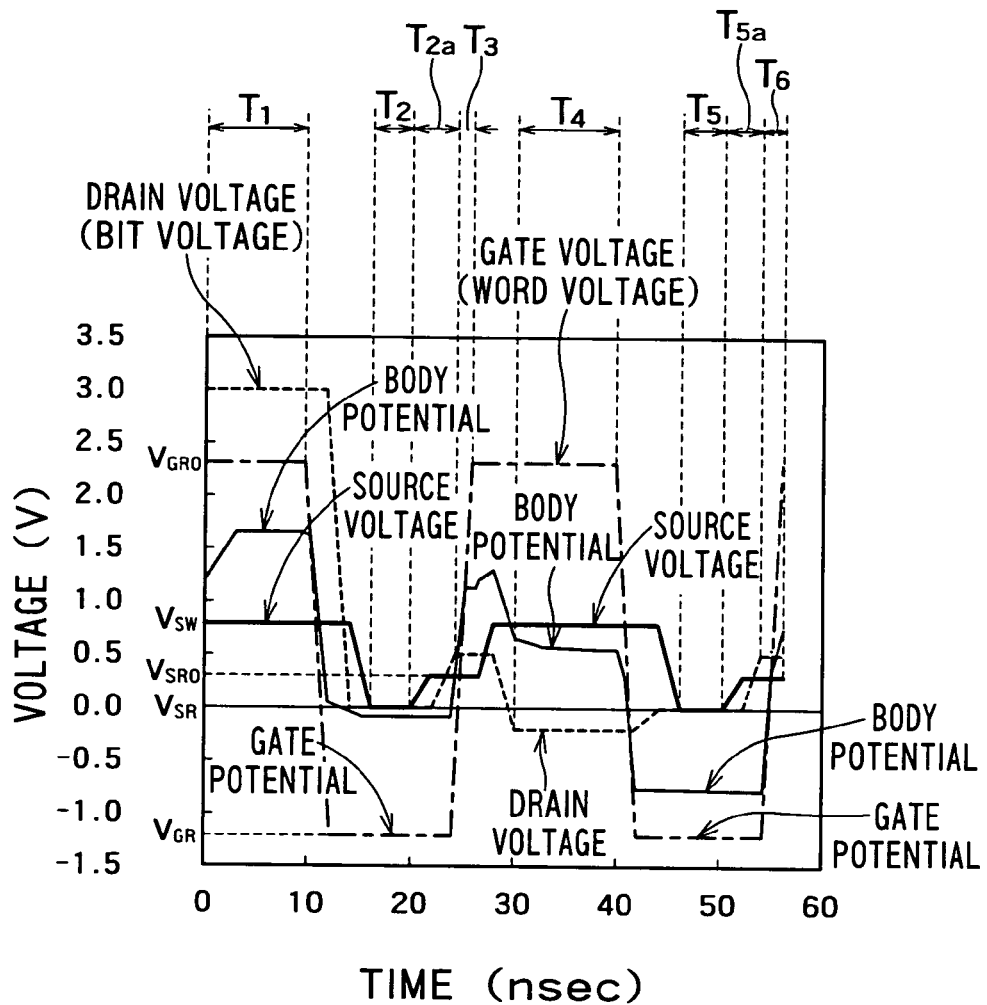
FIG. 6 is a timing chart showing behaviors of the FBC memory 100 according to the second embodiment of the invention.

FIG. 6 is a timing chart showing behaviors of the FBC memory 100 according to the second embodiment of the invention. In the first embodiment, since the source voltage maintains the voltage value for the data-retaining period even in the data read period (time period $T_3$), the threshold voltage difference $\Delta Vt$ of the memory cell decreases. To deal with this issue, the second embodiment controls the source voltage $V_{SRO}$ in the data read period to shift it nearer to the gate voltage $V_{GRO}$ for the data read period than the source voltage $V_{SR}$ for the data-retaining period.

In FIG. 6, operations in time period $T_1$, $T_2$, $T_3$, $T_4$, $T_5$ and $T_6$ are identical to those of the first embodiment shown in FIG. 5. Since operations in time period $T_{2a}$ and operations in time period $T_{5a}$ are identical, operations in time period $T_{2a}$ alone are explained below.

In time period $T_{2a}$ from 20 nsec to 24 nsec, the source voltage is shifted from 0 V to 0.3 V, for example. The shifting direction of the source voltage is equal to the shifting direction of the gate voltage in the data read period. In the period from immediately before the data read operation to the read operation, the source voltage $V_{SRO}$ is changed toward the gate voltage $V_{GRO}$ for the data read period and set to the potential $V_{SRO}$.

In case the source voltage $V_{SRO}$ in the data read period was 0.3 V, the threshold voltage difference $\Delta Vt$ was 0.504 V according to the simulation. Even when the source voltage $V_{SRO}$ was 0.8 V, the threshold voltage difference $\Delta Vt$ was 0.504 V.

In response to an increase of the source voltage from $V_{SR}$ (for example 0 V) to $V_{SRO}$ (for example 0.3 V or more), the junction between the body region 40 and the source layer 20 is reverse-biased. After that, or simultaneously with them, the gate voltage $V_{GRO}$ is raised. Thereby, the second embodiment alleviates the forward voltage applied to the body-source junction, and therefore can suppress annihilation of holes in the body region 40. As a result, the second embodiment can prevent a decrease of the threshold voltage difference $\Delta Vt$.

Third Embodiment

Figure 7:
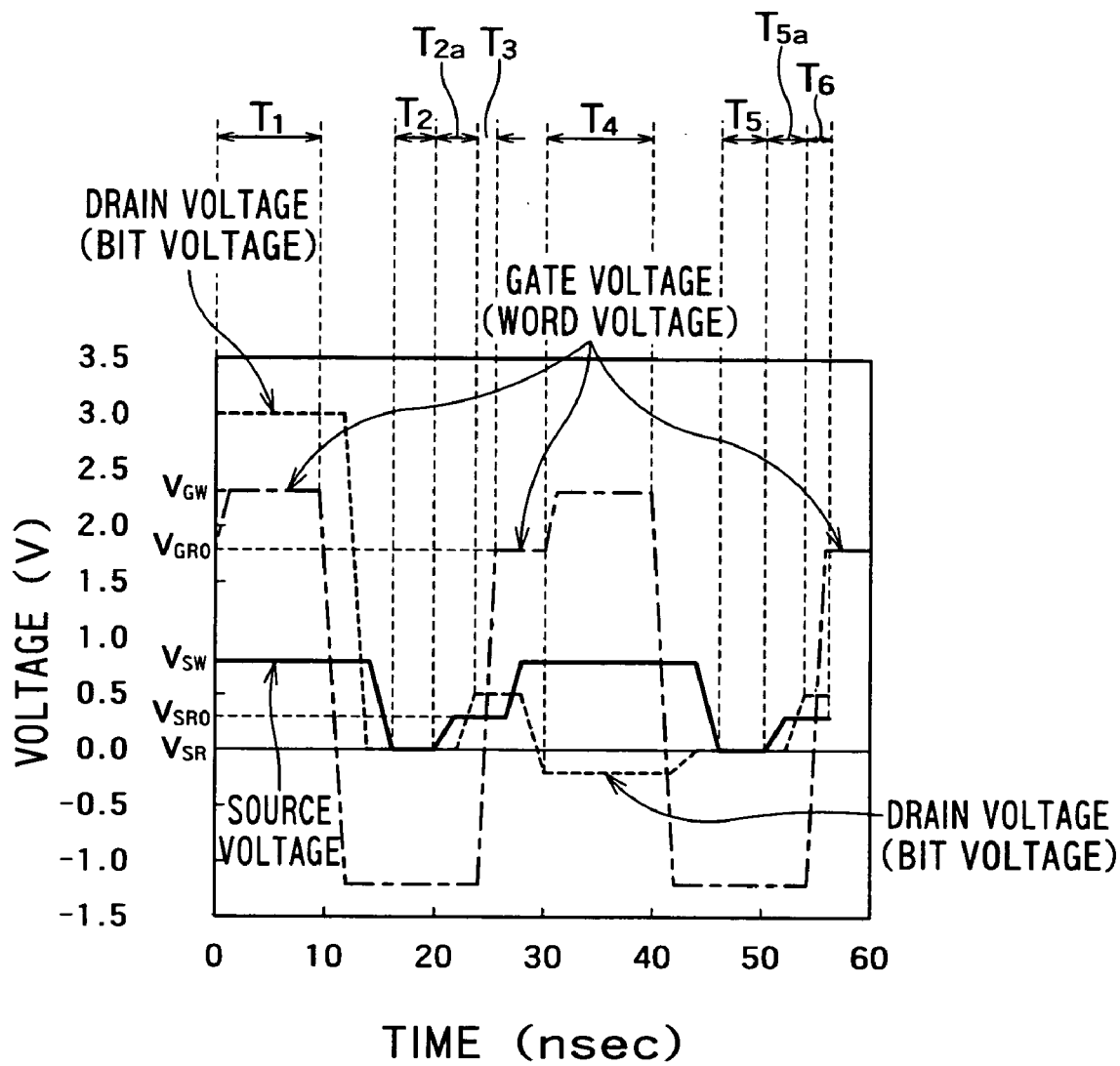
FIG. 7 is a timing chart showing operations of the FBC memory 100 according to the third embodiment of the invention.

FIG. 7 is a timing chart showing operations of the FBC memory 100 according to the third embodiment of the invention. The second embodiment has been explained as the gate voltage $V_{GRO}$ in the data read period (Time period $T_3$) being equal to the gate voltage $V_{GW}$ in the data write period (time period $T_1$, $T_4$).

However, the gate voltage $V_{GW}$ in the data write period is set to ensure a large flow of impact ion current into the body region 40 to enable high-speed write of data "1". In case the data is read out with the same voltage as the gate voltage $V_{GW}$, read current difference between data "0" and data "1" varies for memory cells MC due to variation of parasitic resistance of the source layer 20 and the drain layer 30. This will invite a decrease of the yield.

To cope with the problem, the third embodiment sets the gate voltage $V_{GRO}$ in the data read period nearer to the source voltage $V_{SRO}$ in the data read period than the gate voltage $V_{GW}$ in the data write period as shown in FIG. 7. In the third embodiment, the gate voltage $V_{GRO}$ in the data read period is lower than the gate voltage $V_{GW}$ in the data write period. Thereby, the third embodiment sets the gate-source voltage in the data read period lower than that in the data write period. Preferably, the gate voltage $V_{GRO}$ is set lower than the gate voltage $V_{GW}$ by 0.3 V through 0.5 V. Thus, the read current difference between data "0" and data "1" can be stabilized, and both a high yield and high-speed write operation can be satisfied.

Figure 8:
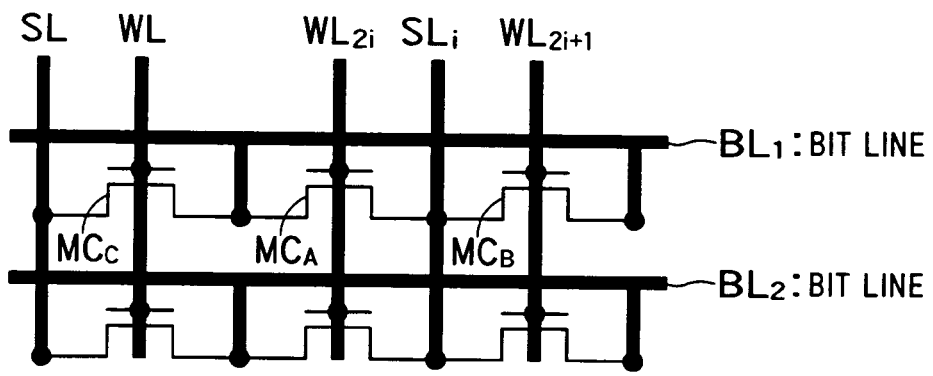
FIG. 8 shows FBC memory cells having an open bit line structure.
Figure 9:
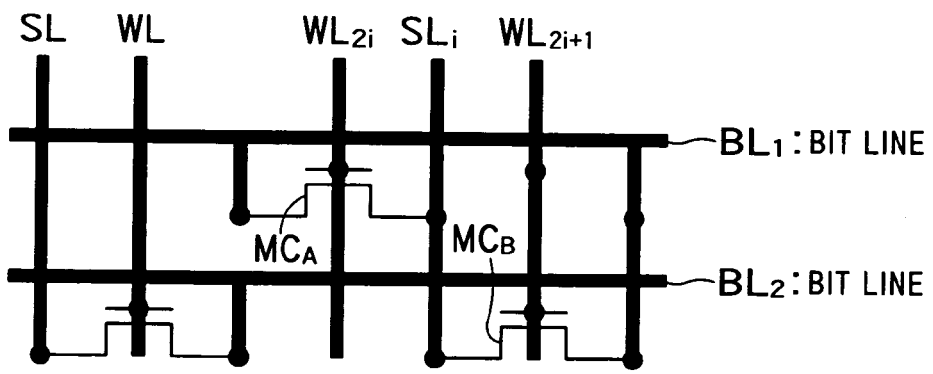
FIG. 9 shows FBC memory cells having a folded bit line structure.

FIG. 8 and FIG. 9 are partial circuit diagrams of FBC memory cells according to the embodiments of the invention. FIG. 8 shows FBC memory cells having an open bit line structure whereas FIG. 9 shows FBC memory cells having a folded bit line structure. FBC memory cells of the open bit line structure detect data by comparing data in the sense amplifier from one memory cell array with a reference signal from the other memory array. FBC memory cells of the folded bit line structure detect data by comparing data from one of two bit lines in a common memory cell array with a reference signal from the other bit line. Embodiments of FIG. 8 and FIG. 9 may employ any of the first to third embodiments as their operations.

In the embodiment of FIG. 8, one source line $SL_i$ can be selected for two word lines $WL_{2i}$ and $WL_{2i+1}$. To write data in the memory cell $MC_A$ or $MC_B$, the source line $SL_i$ is selected. At this time, the source line $SL_i$ is set to 0.8 V, for example.

The remainder source lines other than the source line $SL_i$ are set to the potential for data retainment, i.e. 0 V. Thereby, this embodiment realizes FBC memory enhanced in speed and reduced in power consumption than a model configured to drive all source lines.

In addition, since a part of source lines, namely, the source line $SL_i$ alone, is selected, this embodiment suppresses the phenomenon (called "0" disturb) where data "1" stored in an unselected cell is rewritten to data "0" in error.

Assume here that data "0" should be written in a selected memory cell $MC_A$ while an unselected memory cell $MC_B$ retains data "1". When a large negative voltage is applied to the bit line $BL_1$, it draws out holes not only from the memory cell $MC_A$ but also from the memory cell $MC_B$. As a result, data "0" is written in the unselected memory cell $MC_B$ in error. This is the "0" disturb.

To write data "0" in a selected memory cell, the lower the potential applied to the bit line, the better the result. This is because the threshold voltage difference $\Delta Vt$ between data "0" and data "1" increases. If the potential applied to the bit line is low, the possibility of "0" disturb increases. It has been recognized that the threshold voltage difference $\Delta Vt$ and the "0" disturb are in a trade-off relation, and techniques capable of solving these issues altogether have been anticipated.

In the above-explained embodiment, a certain source line is selected, and a voltage is applied to the selected source line. Therefore, the embodiment can solve both the issue of threshold voltage difference and the issue of "0" disturb.

For example, in the operations of FIG. 5, 2.3 V is applied to the word line $WL_{2i}$ in the period for writing data "0" (time period $T_4$). The source line $SL_i$ is selected from a plurality of source lines SL, and 0.8 V is applied to the source line $SL_i$. Further, −0.2 V is applied to the bit line $BL_1$. Under the condition, the body potential of the selected memory cell was 0.487V.

On the other hand, It is supposed that the memory cell $MC_C$ connected to the bit line $BL_1$ and disconnected to the word lines $WL_{2i}$ and $WL_{2i+1}$ stores data "1". In this case, the potential of the memory cell $MC_C$ is −0.082V. That is, the potential difference between a potential of the body retaining data "1" and a potential of the body being written data "0" was 0.569V.

However, when the source line $SL_i$ was set to 0 V according to the conventional technique, the potential difference between a potential of the body retaining data "1" and a potential of the body being written data "0" was 0.495 V. Thus, this embodiment has been proved to solve the issue of threshold voltage difference and the issue of "0" disturb altogether.

In this case, the source line $SL_i$ is connected to the memory cells $MC_A$ and $MC_B$ commonly. Therefore, in case the memory cell $MC_A$ is selected while the memory cell $MC_B$ is not selected, "0" disturb to the memory cell $MC_B$ is worried about. To cope with this problem, when the memory cell $MC_A$ is selected, potential of the unselected word line $L_{2i+1}$ connected to the memory cell $MC_B$ may be lowered than the potential of other unselected word lines WL. In this manner, it is possible to suppress "0" disturb of the unselected memory cell $MC_B$ commonly connected to the source line $SL_i$ and the bit line $BL_i$, together with the selected memory cell $MC_A$.

Note that the selected word line $WL_{2i}$, when driven, affects all memory cells MC commonly connected to the word line $WL_{2i}$. Therefore, it is desirable to read out data once from all memory cells commonly connected to the word line $WL_{2i}$ and write data again.

As shown in FIG. 9, in the folded bit line structure, memory cells MC deviate by half a pitch in the row direction and in the column direction. Therefore, here are no memory cells that share both a common bit line BL and a common source line SL. That is, the memory cell $MC_A$ and the memory cell $MC_B$ sharing the common source line $SL_i$ are connected to different bit lines $BL_1$ and $BL_2$. Therefore, this embodiment can write data in both memory cells $MC_A$ and $MC_B$ simultaneously.

For example, the embodiment makes it possible to select the word lines $WL_{2i}$ and $WL_{2i+1}$ simultaneously and to write data "0" in the memory cells $MC_A$ and $MC_B$. In this structure, it does not occur that data "0" is accidentally written in memory cells MC connected to word lines WL other than the adjacent selected word lines $WL_{2i}$ and $WL_{2i+1}$.

Note that the selected word lines $WL_{2i}$ and $WL_{2i+1}$, when driven, affect all memory cells MC commonly connected to the word lines $WL_{2i}$ and $WL_{2i+1}$. Therefore, it is desirable to read out data once from all memory cells commonly connected to the word line $WL_{2i}$ and $WL_{2i+1}$ and write data again.

The invention claimed is:

1. A semiconductor memory device comprising:
   a semiconductor layer;
   a source layer provided in the semiconductor layer;
   a drain layer provided in the semiconductor layer;
   a body region provided in the semiconductor layer between the source layer and the drain layer;
   a gate insulation film provided on the body region; and
   a gate electrode provided on the gate insulation film,
   wherein data are written or read out by accumulating electric charge in the body region or releasing electric charge from the body region, and
   wherein a difference between the potential $V_{SR}$ of the source layer in a data-retaining period and the potential $V_{GR}$ of the gate electrode in the data-retaining period is smaller than a difference between the potential $V_{SW}$ of the source layer in a data write period and the potential $V_{GR}$.

2. The semiconductor memory device according to claim 1 wherein, the potential $V_{DR}$ of the drain layer in a data-retaining period is equal to the potential $V_{SR}$.

3. The semiconductor memory device according to claim 2 wherein, upon transition of the semiconductor memory device from the data-write state to the data-retaining state, after potential of the gate electrode becomes the potential $V_{GR}$, potential of the source layer is changed from the potential $V_{SW}$ to the potential $V_{SR}$, and potential of the drain layer is changed from potential $V_{DW}$ in the data write period to the potential $V_{DR}$.

4. The semiconductor memory device according to claim 2 wherein, upon transition of the semiconductor memory device from the data-writing state to the data-retaining state, the potential of the drain layer and the potential of the source layer are changed simultaneously.

5. A semiconductor memory device comprising:
   a semiconductor layer;
   a source layer provided in the semiconductor layer;
   a drain layer provided in the semiconductor layer;
   a body region provided in the semiconductor layer between the source layer and the drain layer;
   a gate insulation film provided on the body region; and
   a gate electrode provided on the gate insulation film,
   wherein data are written or read out by accumulating electric charge in the body region or releasing electric charge from the body region, and
   wherein a difference between the potential $V_{SRO}$ of the source layer in a data-readout period and the potential $V_{GRO}$ of the gate electrode in the data-readout period is smaller than a difference between the potential $V_{SR}$ of the source layer in a data-retaining period and the potential $V_{GRO}$.

6. The semiconductor memory device according to claim 5 wherein, a difference between the potential $V_{SR}$ and the potential $V_{GR}$ of the gate electrode in the data-retaining period is smaller than a difference between the potential $V_{sw}$ of the source layer in a data write period and the potential $V_{GR}$.

7. The semiconductor memory device according to claim 5 wherein, upon transition of the semiconductor memory device from the data-retaining state to the data-write state, before the potential of the gate electrode becomes the potential $V_{GRO}$, the potential of the source layer becomes the potential $V_{SRO}$.

8. The semiconductor memory device according to claim 5 wherein, a difference between the potential $V_{GRO}$ and the potential $V_{SRO}$ is smaller than a difference between the potential $V_{GW}$ of the gate electrode in a data write period and the potential $V_{SRO}$.

9. The semiconductor memory device according to claim 1 or 5 comprising a memory cell array including memory cells arranged in matrix form, each memory cell comprising the semiconductor layer, the source layer, the drain layer, the body region, the gate insulation film and the gate electrode, the memory cell array further including a plurality of source lines provided along with columns or rows of the memory cell array and connected to the source layer, the semiconductor memory device selectively applying potential to one source line of the plurality of source lines.

10. A method of driving a semiconductor memory device, including a semiconductor layer, a source layer provided in the semiconductor layer, a drain layer provided in the semiconductor layer, a body region provided in the semiconductor layer between the source layer and the drain layer, a gate insulation film provided on the body region and a gate electrode provided on the gate insulation film, comprising:

applying potential $V_{GW}$ to the gate electrode and applying potential $V_{SW}$ to the source layer, thereby executing data write; and applying potential $V_{GR}$ to the gate electrode and applying potential $V_{SR}$ to the source layer, and thereby retaining data, the potential $V_{SR}$ having a smaller difference from the potential $V_{GR}$ than the difference between the potential $V_{SW}$ and the potential $V_{GR}$.

11. The method according to claim 10 further comprising:

applying potential $V_{GW}$ to the gate electrode and applying potential $V_{DW}$ to the drain layer, when data writing; and applying potential $V_{GR}$ to the gate electrode and applying potential $V_{DR}$, which is equal to the potential $V_{SR}$, to the drain layer, when data retaining.

12. The method according to claim 10 wherein, upon transition of the semiconductor memory device from the data-write state to the data-retaining state, after potential of the gate electrode is changed from the potential $V_{GW}$ to the potential $V_{GR}$, potential of the source layer is changed from the potential $V_{SW}$ to the potential $V_{SR}$, and potential of the drain layer is changed from potential $V_{DW}$ in the data write period to the potential $V_{DR}$.

13. The method according to claim 11 wherein, upon transition of the semiconductor memory device from the data-writing state to the data-retaining state, the potential of the drain layer and the potential of the source layer are changed simultaneously.

14. A method of driving a semiconductor memory device, including a semiconductor layer, a source layer provided in the semiconductor layer, a drain layer provided in the semiconductor layer, a body region provided in the semiconductor layer between the source layer and the drain layer, a gate insulation film provided on the body region and a gate electrode provided on the gate insulation film, comprising:

applying potential $V_{GR}$ to the gate electrode and applying potential $V_{SR}$ to the source layer, thereby executing data write; and applying potential $V_{GRO}$ to the gate electrode and applying potential $V_{SRO}$ to the source layer, and thereby read out data, the potential $V_{SRO}$ having a smaller difference from potential $V_{GRO}$ of the gate electrode in the data write period than the difference between the potential $V_{SR}$ and the potential $V_{GRO}$.

15. The method according to claim 14 wherein, a difference between the potential $V_{SR}$ and the potential $V_{GR}$ of the gate electrode in the data-retaining period is smaller than a difference between the potential $V_{SW}$ of the source layer in a data write period and the potential $V_{GR}$.

16. The method according to claim 14 wherein, upon transition of the semiconductor memory device from the data-write state to the data-retaining state, after the potential of the gate electrode is changed to the potential $V_{GR}$, the potential of the source layer is changed to the potential $V_{SR}$.

* * * * *